US00RE40283E

(19) United States
(12) Reissued Patent
Inaba et al.

(10) Patent Number: US RE40,283 E
(45) Date of Reissued Patent: May 6, 2008

(54) MOUNTING APPARATUS FOR ELECTRONIC COMPONENT

(75) Inventors: Yuzuru Inaba, Kurume (JP); Kiyoshi Imai, Kofu (JP); Hideaki Watanabe, Kofu (JP); Hiromi Kinoshita, Kai (JP)

(73) Assignee: Matsushita Electric Industrial Co., Ltd., Osaka-Fu (JP)

(21) Appl. No.: 11/108,105
(22) Filed: Apr. 18, 2005

Related U.S. Patent Documents

Reissue of:
(64) Patent No.: 5,797,178
Issued: Aug. 25, 1998
Appl. No.: 09/605,774
Filed: Feb. 22, 1996

(30) Foreign Application Priority Data

Feb. 22, 1995 (JP) ..... 7-034022

(51) Int. Cl.
*B23P 19/00* (2006.01)
H05K 3/30

(52) U.S. Cl. ..... 29/741; 29/703; 29/715; 29/719; 29/838; 29/566.3

(58) Field of Classification Search ..... 29/703, 29/715, 738, 740–743, 566.3, 566.4, 834; 227/76, 94, 95; 294/64.1, 64.2
See application file for complete search history.

(56) References Cited

U.S. PATENT DOCUMENTS

| | | | | |
|---|---|---|---|---|
| 4,135,630 | A | | 1/1979 | Snyder et al. |
| 4,329,776 | A | | 5/1982 | Mori et al. |
| 4,356,949 | A | | 11/1982 | Snyder et al. |
| 4,429,456 | A | | 2/1984 | Zahn |
| 4,628,595 | A | | 12/1986 | Fujita et al. |
| 4,635,341 | A | | 1/1987 | Staudinger |
| 4,744,141 | A | | 5/1988 | Musiani |
| 4,745,679 | A | | 5/1988 | Shinano et al. |
| 4,750,263 | A | | 6/1988 | Yagi |
| 4,753,382 | A | | 6/1988 | Bajpai |
| 4,757,600 | A | | 7/1988 | Holcomb |
| 4,759,112 | A | | 7/1988 | McLean |
| 4,760,639 | A | | 8/1988 | Richter |
| 5,119,536 | A | | 6/1992 | Leitz et al. |
| 5,145,047 | A | | 9/1992 | Terracol et al. |
| 5,165,165 | A | | 11/1992 | Aoki et al. |
| 5,457,874 | A | | 10/1995 | Yonezawa et al. |
| 6,115,908 | A | * | 9/2000 | Inaba et al. ..... 29/741 |
| 6,412,166 | B1 | * | 7/2002 | Inaba et al. ..... 29/741 |

FOREIGN PATENT DOCUMENTS

| | | |
|---|---|---|
| EP | 0013979 | 8/1980 |
| EP | 0 118 629 | 9/1984 |
| GB | 2017540 | 10/1979 |
| GB | 2 120 583 | 12/1983 |
| GB | 2 204 256 | 11/1988 |
| GB | 2 250 458 | 6/1992 |
| JP | 52-92371 | 8/1977 |
| JP | 59-172299 | 9/1984 |
| JP | 60-245200 | 12/1985 |
| JP | 03-034344 | 2/1991 |
| JP | 03-215998 | 9/1991 |
| JP | 06-126677 | 5/1994 |
| WO | 86/03371 | 6/1986 |

* cited by examiner

*Primary Examiner*—Minh Trinh
(74) *Attorney, Agent, or Firm*—Wenderoth, Lind & Ponack, L.L.P.

(57) ABSTRACT

An apparatus is provided with a component feeding member for feeding electronic components having lead wires in a tape-bonded state, an insertion head for separating the electronic components fed from the feeding member from the tapes and inserting to holes of a board, and a fixing head facing the insertion head via the board for cutting and folding the lead wires of the inserted electronic component in the board thereby fixing the electronic component to the board. AC servo motors operating independently of each other are individually set in the insertion head and the fixing head, which are controlled by a device so as to be synchronous with each other.

2 Claims, 5 Drawing Sheets

MOUNTING APPARATUS FOR ELECTRONIC COMPONENT

Matter enclosed in heavy brackets [ ] appears in the original patent but forms no part of this reissue specification; matter printed in italics indicates the additions made by reissue.

BACKGROUND OF THE INVENTION

The present invention relates to an apparatus for automatically mounting electronic components to a board, and more particularly to an apparatus which is adapted to insert electronic components having lead wires to holes of a board, cut and fold the lead wires and fix the electronic components to the board.

In a conventional mounting apparatus of the type referred to above, there are arranged a table part for positioning a board at a predetermined position, a feeding part for feeding tape-bonded electronic components having lead wires, an insertion head for separating the electronic components supplied from the feeding part from the tapes and inserting then in to holes of the board, and a fixing head opposed to the insertion head via the board for fixing the electronic components to the board after cutting and folding the lead wires of the inserted electronic components. One AC servo motor is used as a driving source for the insertion head and the fixing head because of a necessity to synchronize both heads. The AC servo motor is connected directly with the insertion head, but connected to the fixing head via timing pulleys and a timing belt to transmit a driving force, thereby driving both heads synchronously. A chain and sprockets, or gears and a transmission shaft, are used in some cases instead of the timing pulleys and the timing belt.

The conventional apparatus will be described with reference to FIG. 4. The apparatus consists of components designated by 33–43. More specifically, in FIG. 4, an electronic component having lead wires is supplied from a feeding part 31 in a tape-bonded state. The electronic component is separated from the tapes before the electronic component is inserted in to a hole of a board 32 by an insertion head 33. A fixing head 34 facing the insertion head 33 via the board 32 cuts and folds the lead wires of the electronic component inserted in to the board, then fixes the electronic component to the board 32. A single driving source, i.e., AC servo motor 35, applies a driving force simultaneously to the insertion head 33 and the fixing head 34. Besides the above-described component parts, the apparatus includes a timing pulley 36 set at an output shaft of the AC servo motor 35, a timing pulley 37 at a driving shaft of the fixing head 34, a timing belt 38 for transmitting a driving force of the timing pulley 36 to the timing pulley 37, a manual handle 39 for bringing rotary encoders connected to the insertion head 33 and the fixing head 34 to origins of the encoders after the apparatus stops, a cam 40 as a part of the insertion head 33, a lever 41 for driving the insertion head 33 in association with the cam 40, a cam 42 as a part of the fixing head 34, and a lever 43 following the cam 42 for driving the fixing head 34.

The above mounting apparatus operates in the following manner. First, the insertion head 33 is driven by a driving force of the AC servo motor 35. The electronic component is received from the feeding part 31 and inserted in to the hole of the board 32. At the same time, the driving force of the AC servo motor is transmitted via the timing pulleys 36, 37 and timing belt 38 to drive the fixing head 34. As a result, the lead wires of the electronic component inserted to the hole of the board 32 are cut and folded, and the electronic component is thus fixed to the board 32.

The above constitution necessitates the single driving source to drive both the insertion head 33 and the fixing head 34, generating a large rotational load. The AC servo motor 35 becomes disadvantageously bulky in size. Moreover, a large inertia of the rotational load lengthens the time for activating or stopping the apparatus. Further, distant shafts such as those of the insertion head 33 and fixing head 34 have to be simultaneously driven in an interlocking manner with the use of the transmission component, e.g., the timing belt 38 or the like, causing the apparatus to be complicated in structure. The amount of stroke cannot be changed by an up-down mechanism consisting of the cam 42 and lever 43 in the fixing head 34, and the assembly of the up-down mechanism is hard to adjust, complicated in structure and large in size. Since a lifting part for moving the whole fixing head 34 up and down and a folding part for cutting and folding the lead wires of the electronic components and fixing the electronic components to the board are driven by one driving source, the rotational load is increased to make the driving motor large. The inertia of the rotational load is so large that a long time is required for stopping and starting the apparatus.

SUMMARY OF THE INVENTION

An object of the present invention is to provide a mounting apparatus for electronic components which is simplified in structure, with a driving motor miniaturized in size, whereby a time for starting and stopping the apparatus is shortened, thereby reducing a mounting cycle time.

In accomplishing these and other aspects, according to one aspect of the present invention, there is provided an apparatus for mounting electronic components, comprising an electronic component feeding member for feeding electronic components having lead wires in a tape-bonded with tapes.

An insertion head inserts the lead wires of one of the electronic components fed from the feeding member into holes of a board after separating the lead wires from the tapes.

A fixing head faces the insertion head via the board for cutting and folding the lead wires of the electronic component inserted in the holes of the board, and fixes the electronic component to the board.

A driving source is set for each of the insertion head and the fixing head to independently drive the corresponding head.

A synchronizing device synchronizes the driving sources.

According to another aspect of the present invention, there is provided an apparatus for mounting electronic components, comprising an electronic component feeding member for feeding electronic components with lead wires in a tape-bonded state by use of tapes.

An insertion head inserts the lead wires of one of the electronic components fed from the feeding member into holes of the board after separating the components from the tapes.

A fixing head faces the insertion head via the board for cutting and folding the lead wires of the electronic component inserted in to the holes of the board and fixes the electronic component to the board. The fixing head includes a lifting part for moving the whole fixing head up and down and a folding part arranged inside the fixing head for cutting and folding the lead wires of the electronic component.

A first driving motor is provided for the insertion head.

A cam is fitted at a driving shaft connected to the first driving motor for driving the insertion head.

An encoder detects a rotating position of a rotor of the driving motor.

A second driving motor and an encoder detects a rotating position of a rotor of the second driving motor, with which each of the lifting part and the folding part is equipped.

BRIEF DESCRIPTION OF THE DRAWINGS

These and other aspects and features of the present invention will become clear from the following description taken in conjunction with the preferred embodiments thereof and with reference to the accompanying drawings, in which.

DETAILED DESCRIPTION OF THE PREFERRED EMBODIMENTS

Figure 1:
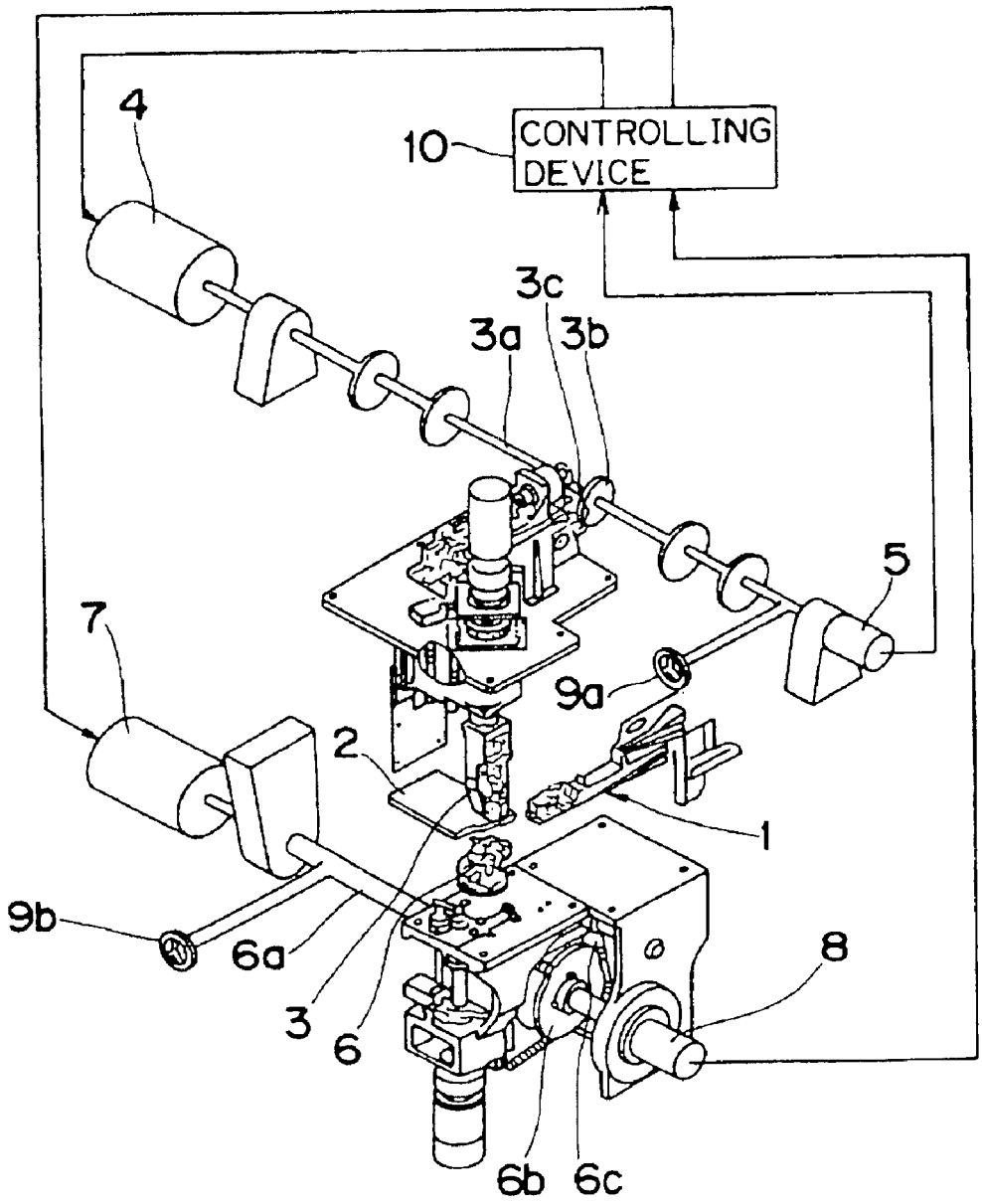
FIG. 1 is a perspective view of a mounting apparatus for electronic components according to a first embodiment of the present invention.

Before the description of the present invention proceeds, it is to be noted that like parts are designated by like reference numerals throughout the accompanying drawings.

A preferred embodiment of the present invention will be described with reference to the accompanying drawings.

Figure 5:
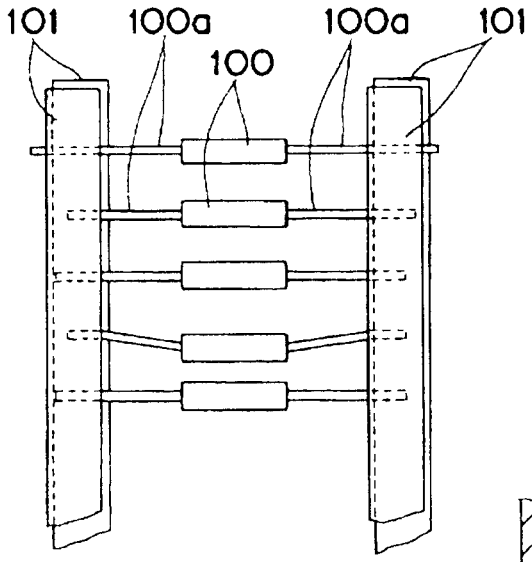
Fig. 5 PRIOR ART
FIG. 5 is a front view of electronic components with lead wires in a tape-bonded state.
Figure 6:
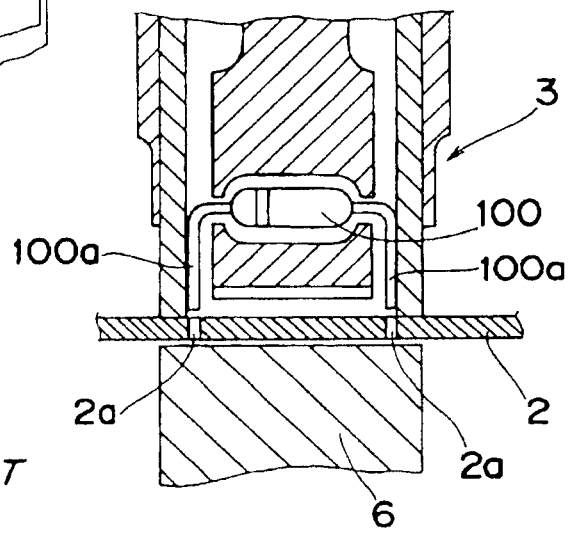
FIG. 6 is a sectional view showing a state where an electronic component is inserted into holes of a board by the use of an insertion head of the mounting apparatus.

FIG. 1 shows a first embodiment of the present invention. In FIG. 1, reference numeral 1 is a component feeding member for feeding electronic components 100 with lead wires 100a in a tape-bonded state by the use of tapes 101 as shown in FIG. 5. Reference numeral 2 is a board to which the electronic components 100 are mounted. Reference numeral 3 is an insertion head separating the electronic components 100 supplied by the feeding member 1 from the tapes 101 and inserting the lead wires 100a of the component 100 to holes 2a of the board 2 as shown in FIG. 6. Reference numeral 4 is an AC servo motor used as a driving source for impressing a driving force to the insertion head 3, and is directly coupled to a driving shaft 3a of the insertion head 3. An encoder 5 is set at the driving shaft 3a to detect a rotating position of the shaft 3a. Moreover, a cam 3b which is part of the insertion head 3 is fixed to the driving shaft 3a. A driver lever 3c moving the insertion head 3 operates following the cam 3b.

Reference numeral 6 is a fixing head opposed to the insertion head 3 via the board 2. The fixing head 6 cuts and folds the lead wires 100a of the electronic components 100 inserted in to the holes 2a of the board 2 and fixes the electronic components 100 to the board 2.

Reference numeral 7 is an AC servo motor which is used as a driving source to apply a driving force to the fixing head 6. The AC servo motor 7 is directly coupled to a driving shaft 6a of the fixing head 6. The driving shaft 6a is equipped with an encoder 8 to detect a rotating position thereof. The driving shaft 6a also has a cam 6b fixed thereto. The cam 6b, as part of the fixing head 6, is accompanied during operation by a driving lever 6c driving the fixing head 6.

Output signals from the encoder 5 of the insertion head 3 and the encoder 8 of the fixing head 6 are input to a controlling device 10. The AC servo motor 4 of the insertion head 3 and the AC servo motor 7 of the fixing head 6 are driven synchronously by the controlling device 10. Reference numeral 9a is a manual handle used for bringing the encoder 5 of the insertion head 3 to an origin of the encoder 5 and reference numeral 9b is a manual handle for bringing the encoder 8 of the fixing head 6 to an origin of the encoder 8.

Figure 7:
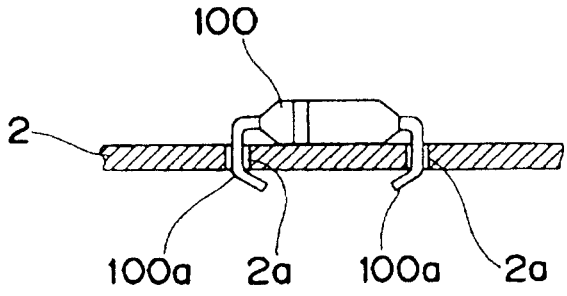
Fig. 7 PRIOR ART
FIG. 7 is a sectional view showing a state where an electronic component is inserted into holes of a board and fixed to the board by the use of the insertion head and fixing head.

Now the operation will be described. When the insertion head 3 is driven by a driving force of the AC servo motor 4, the lead wires 1Oa of the electronic component 100 in the component feeding member 1 are separated from the tapes 101 and taken out so that the lead wires 100a of the component 100 are inserted in to the holes 2a of the board 2. Simultaneously with this, the fixing head 6 is driven by a driving force of the AC servo motor 7, so that the lead wires 100a of the electronic component 100 inserted to the holes 2a of the board 2 are cut and folded to secure the component 100 to the board 2 as shown in FIG. 7. The insertion head 3 and fixing head 6 are moved by the respective cams 3b and 6b. The rotation of the AC servo motors 4 and 7 driving the driving shafts 3a and 6a with having the cams 3b and 6b are controlled in synchronization with each other by the controlling device 10 on the basis of output signals from the encoders 5 and 8 directly coupled to the motors 4, 7. Therefore, the insertion head 3 and fixing head 6 operate synchronously. The encoders 5, 8 of the insertion head 3 and fixing head 6 are brought to their respective origins by the corresponding manual handles 9a and 9b.

In the embodiment, since the driving sources are separately provided for the insertion head 3 and fixing head 6, the driving motors can be small in size and a time required to stop and start the motors is reduced.

Figure 2:
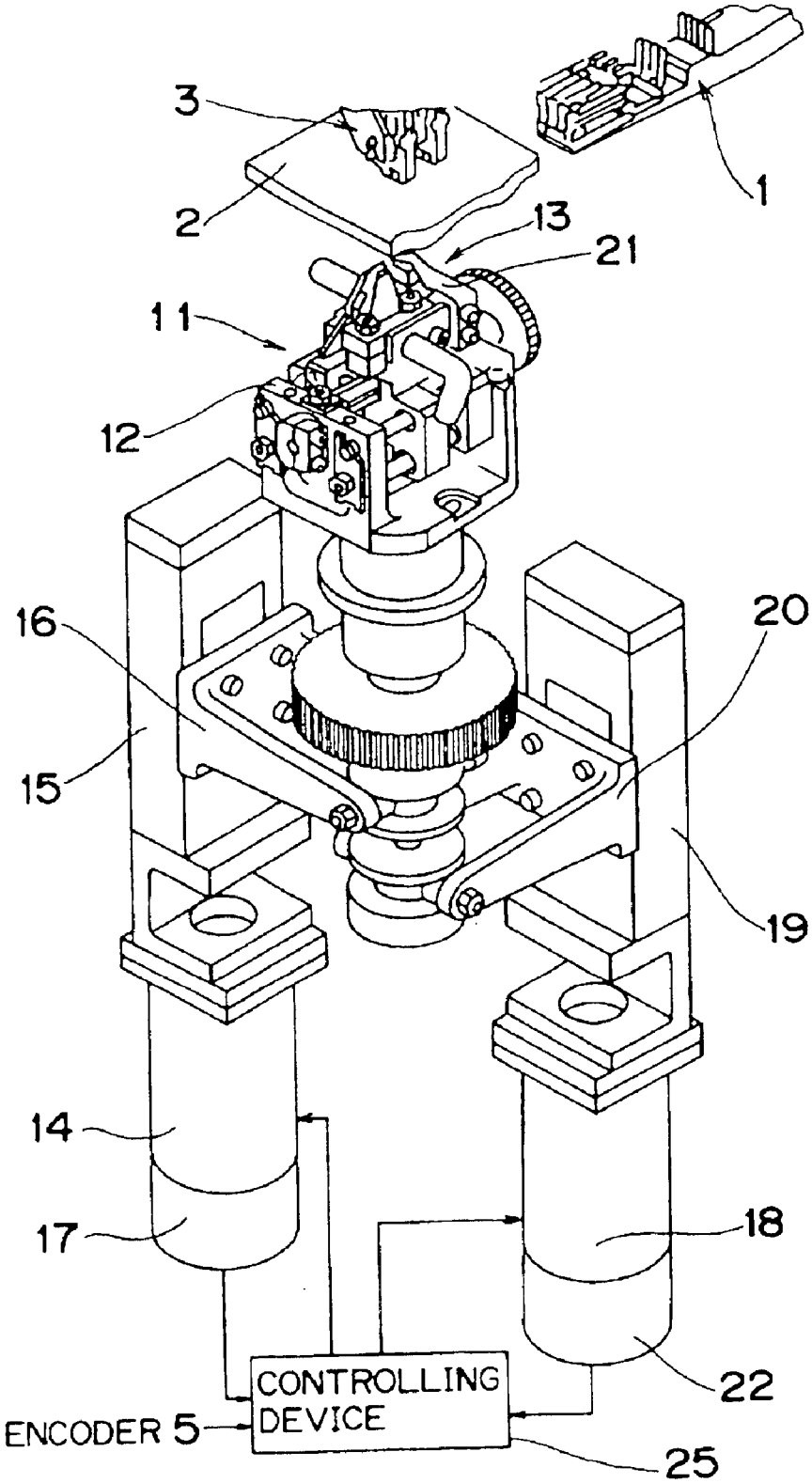
FIG. 2 is a perspective view of a fixing head of a mounting apparatus for electronic components according to a second embodiment of the present invention.
Figure 3:
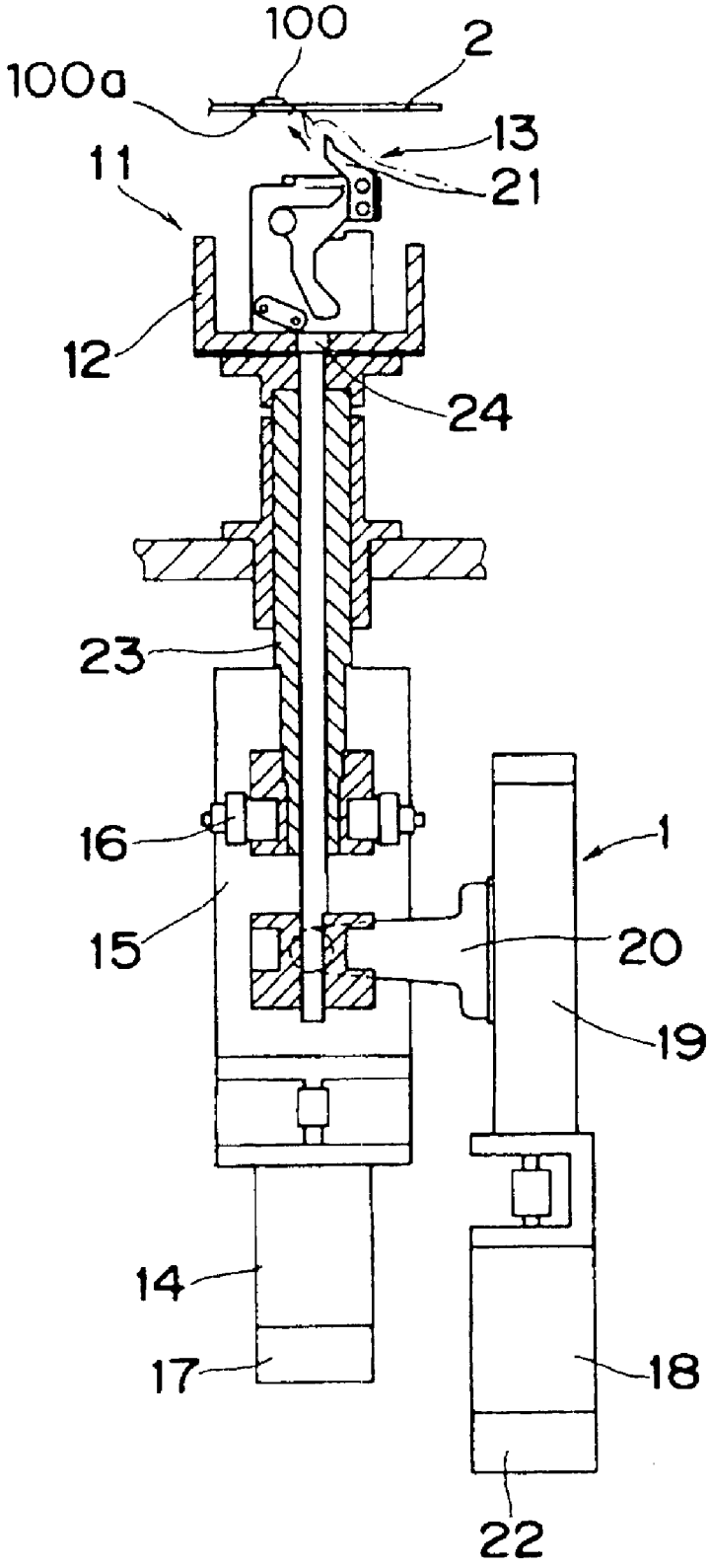
FIG. 3 is a longitudinal sectional view of the fixing head of FIG. 2.
Figure 4:
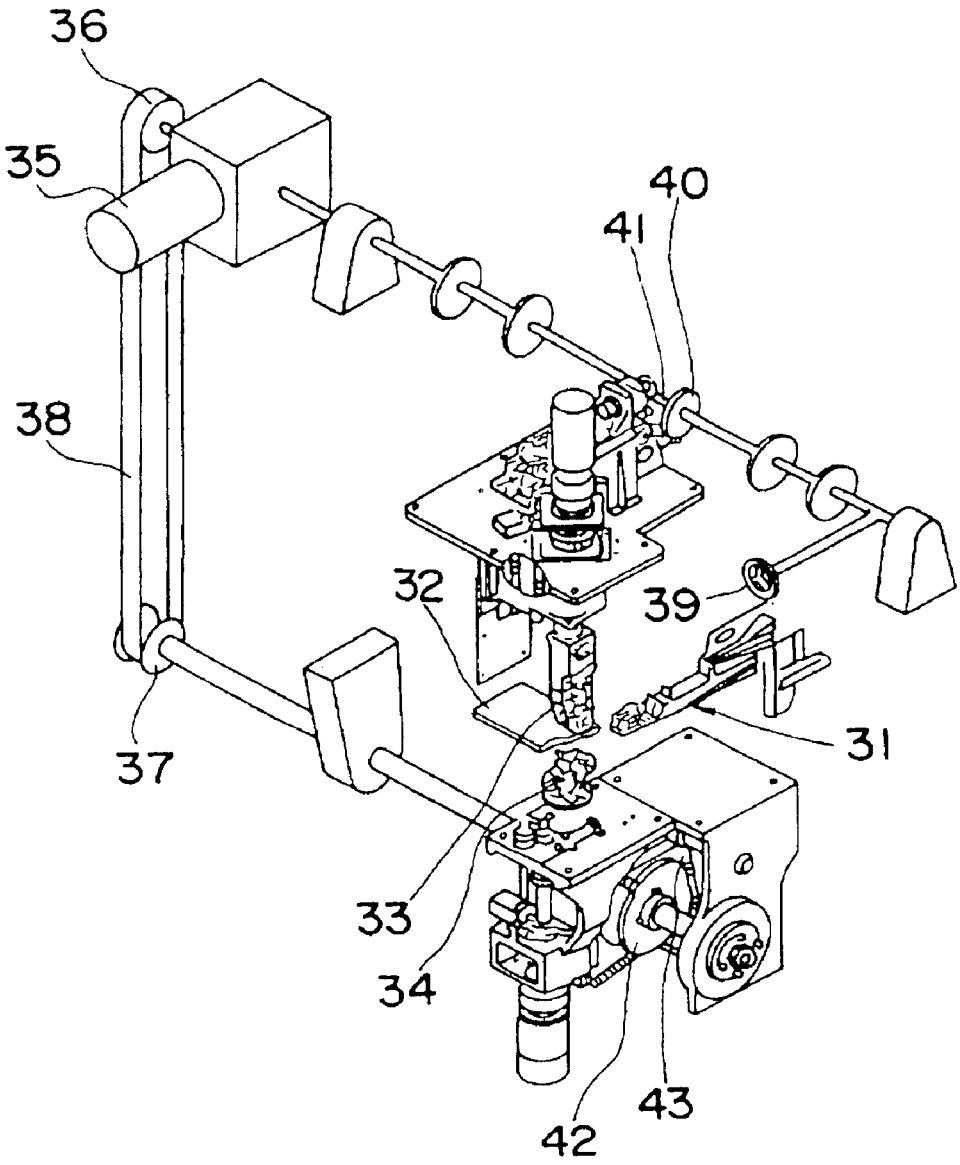
Fig. 4 PRIOR ART
FIG. 4 is a perspective view of a conventional apparatus for mounting electronic components.

A second embodiment of the present invention will be discussed with reference to FIGS. 2 and 3. FIGS. 2 and 3 show a fixing head of the embodiment. The component feeding member 1 and the insertion head 3 have the same constitution as in the first embodiment, and therefore the description and illustration thereof will be abbreviated.

Referring to FIG. 2, a fixing head 11 is constructed by a lifting part 12 and a folding part 13 each having a driving source. The lifting part 12 is composed of an AC servo motor 14 as the driving source, an actuator 15 constructed by a ball screw converting the rotation of AC servo motor 14 to the linear motion and a linear guide having high accuracy, an arm 16 fixedly connected to the actuator 15, and an encoder 17 for detecting a rotating position of the AC servo motor 14. The folding part 13 comprises an AC servo motor 18 as a driving source, an actuator 19 constructed by a ball screw converting the rotational motion of AC servo motor 18 to the linear motion and a highly accurate linear guide, an arm 20 tightly coupled to the actuator 19, a movable blade 21 interlocking with the arm 20, and an encoder 22 for detecting a rotating position of the AC servo motor 18. Lead wires of an electronic component inserted in to the board 2 are cut and folded by the movable blade 21, and then the electronic component is fixed to the board 2. Output signals of the encoders 17 and 22 detecting the rotating positions of the AC servo motors 14 and 18 and the output signal of the encoder 5 of the insertion head 3 are input to a controlling device 25. The AC servo motors 14 and 18 of the lifting part 12 and folding part 13 of the fixing head 11 are accordingly driven based on the output signal from the encoder 5 of the insertion head 3, so that the insertion head 3, and the lifting part 12 and the folding part 13 of the fixing head 11, are synchronized with one another.

In FIG. 3, a slidable shaft 23 is coupled to the arm 16 to move the lifting part 12 up and down. A shaft 24 for driving the movable blade 21 is inserted in the shaft 23 in a slidable fashion and coupled to the arm 20.

The operation of the fixing head 11 in the abovedescribed constitution will now be described. The rotation of the AC servo motor 14 as a driving source is transmitted to the actuator 15, which converts the rotating motion to the linear motion. The arm 16 and the shaft 23 are interlocked with the up/down movement of the actuator 15, whereby the fixing head 11 is moved up near the board 2. Then, the rotation of the AC servo motor 18 as a driving source is transmitted to the actuator 19, which converts the rotation to the linear motion, and the arm 20 and the shaft 24 are moved in an interlocking manner with the up/down movement of the actuator 19. As a consequence, the movable blade 21 is moved to cut and fold the lead wires of the electronic component inserted in to the holes of the board 2 by the insertion head 3. The electronic component is fixed to the board 2 in this manner.

In the fixing head 11 of the embodiment, since the lifting part 12 and the folding part 13 are provided with the AC servo motors 14 and 18, respectively, a moving distance in the up/down direction of the lifting part 12 and a moving distance of the folding part 13 can be set freely. Moreover, a driving shaft, a cam, a lever, etc. required for interlocking the parts 12 and 13 can be eliminated, whereby the fixing head becomes compact in size. Besides, the operation cycle time is shortened with the same driving force.

In the mounting apparatus of the present invention, as is made clear from the foregoing description, the insertion head and the fixing head are separately provided with respective driving sources which drive independently of each other. Therefore, the rotational load and the inertial force of the rotational load of each driving source can be reduced, helping to make the driving motor compact. The apparatus as a whole is thus made compact.

Further, the time used to stop and start the apparatus can be shortened, which leads to a decrease of the mounting cycle time. The driving sources can be driven synchronously by the controlling device in the simple constitution, and the number of assembling steps can be reduced.

Since the insertion head and the fixing head are synchronized based on the output signals of the encoders while the encoder and the driving motor are set at the driving shaft of each head, the synchronization can be achieved with a high reliability in a simple and inexpensive structure.

When the driving motor and the encoder for detecting the rotating position are installed at each of the lifting part and the folding part of the fixing head, the moving distance in the up/down direction of the lifting part and the moving distance of the folding part can be freely set and, moreover, a driving shaft, a cam, a lever and the like for interlocking both parts can be eliminated. Accordingly, the apparatus becomes compact with the operation cycle time reduced with the same driving force.

The insertion head, and the lifting part and the folding part of the fixing head, are synchronously driven based on the output signal from the encoder of the insertion head. The synchronization can be realized with a high reliability in a simple construction.

Although the present invention has been fully described in connection with the preferred embodiments thereof and with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for mounting electric components, comprising:

an electric component feeding member for feeding electronic components with lead wires tape-bonded by tapes;

an insertion head for inserting into holes of a board the lead wires of one of the electronic components fed from the feeding member after separating from the tapes;

a fixing head facing the insertion head via the board for cutting and folding the lead wires of the electronic component to the board, the fixing head including a lifting part for moving the whole fixing head up and down and a folding *part for cutting and folding* the lead wires of the electronic component;

a first driving motor for the insertion head;

a cam, fitted at a driving shaft connected to the first driving motor, for driving the insertion head;

an encoder for detecting a rotating position of a rotor of the first driving motor; and each of the lifting part and the folding part being equipped with a second driving motor and an encoder for detecting a rotating position of a rotor of the second driving motor.

2. The mounting apparatus according to claim 1, further comprising a device for synchronizing the insertion head and the fixing head with each other by driving the driving motors of the lifting part and the folding part of the fixing head based on an output signal of the encoder of the insertion head.

* * * * *